(12) United States Patent
Ito et al.

(10) Patent No.: US 6,664,609 B2
(45) Date of Patent: Dec. 16, 2003

(54) HIGH FREQUENCY DIFFERENTIAL AMPLIFICATION CIRCUIT WITH REDUCED PARASITIC CAPACITANCE

(75) Inventors: Junji Ito, Hirakata (JP); Ikuo Imanishi, Ohtsu (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 0 days.

(21) Appl. No.: 10/103,044

(22) Filed: Mar. 21, 2002

(65) Prior Publication Data
US 2002/0135045 A1 Sep. 26, 2002

(30) Foreign Application Priority Data

Mar. 26, 2001 (JP) ........................................ 2001-087008

(51) Int. Cl.[7] .............................................. H01L 29/00
(52) U.S. Cl. .................... 257/560; 257/566; 257/577; 438/338; 438/342
(58) Field of Search ................................. 257/566, 577, 257/557–564; 438/205, 313, 340, 328, 329, 330, 316, 325, 335, 338, 342

(56) References Cited

U.S. PATENT DOCUMENTS 5,670,417 A * 9/1997 Lambson et al. ............ 438/316
5,773,873 A * 6/1998 Kuriyama .................... 257/563

* cited by examiner

Primary Examiner—Nathan J. Flynn
Assistant Examiner—Scott R Wilson

(57) ABSTRACT

Disclosed is a circuit layout of a differential amplification circuit that constitutes a Gilbert cell, in which two multiple finger bipolar transistors forming a differential amplifier are positioned substantially axially symmetrical to each other. The longitudinal direction of each finger is orthogonal to the axis of symmetry. A wiring connected to an emitter electrode of each one of the transistors is laid so as to extend in a direction opposite to the other one of the transistors.

12 Claims, 9 Drawing Sheets

HIGH FREQUENCY DIFFERENTIAL AMPLIFICATION CIRCUIT WITH REDUCED PARASITIC CAPACITANCE

BACKGROUND OF THE INVENTION (1) Field of the Invention

The present invention relates to an integrated circuit device that includes a differential amplification circuit, and particularly to an improvement in the high-frequency operation of the integrated circuit device.

(2) Related Art

In recent years, active developments have been made in high-frequency integrated circuit devices for use in telecommunication equipment, aiming at further promoting broadband wireless communications. The high-frequency integrated circuit devices include circuits such as a Gilbert cell, in which a differential amplification circuit and an emitter follower are usually incorporated.

A "Gilbert cell" has a configuration in which a circuit formed by cross-connecting two differential amplification circuits is connected in series to one differential amplification circuit. It is also called a "Gilbert multiplier" (Paul R. Gray, Robert G. Meyer, *Analysis and Design of Analog Integrated Circuits*, John Wiley & Sons, 1977).

FIG. 1 is a circuit diagram showing a circuit configuration of a typical Gilbert cell. In FIG. 1, the Gilbert cell 1 includes input terminals T14 and T15 into which a high-frequency reception signal (an RF signal) is inputted, input terminals T12 and T13 into which a local-oscillator signal (an LO signal) is inputted, and output terminals T10 and T11 from which an intermediate frequency signal (an IF signal) that has a lower frequency is outputted.

The IF signal is generated by superimposing (a) a signal whose frequency equals to a sum of a frequency of the RF signal and a frequency of the LO signal and (b) a signal whose frequency equals to a difference between the frequency of the RF signal and the frequency of the LO signal. Note here that both the RF signal and the LO signal are balanced input, and therefore, the Gilbert cell 1 is a so-called double balanced mixer.

Transistors Tr14 and Tr15 and resistors R10 and R11 form a differential amplification circuit. The resistor R10 is connected to an emitter of the transistor Tr14 and the resistor R11 is connected to an emitter of the transistor Tr15.

This differential amplification circuit is used as a linear amplification circuit. The resistors R10 and R11 are provided to increase an input voltage range of the differential amplification circuit. Specifically, an input dynamic range of the differential amplification circuit is adjusted by appropriately selecting resistance values of the resistors R10 and R11.

Conventionally, it is common that circuit layouts of integrated circuit devices are determined based on circuit diagrams. A circuit layout of the above Gilbert cell is also determined based on a circuit diagram. FIG. 2 shows an example of a conventional circuit layout of the Gilbert cell, particularly the transistors Tr14 and Tr15, having the circuit configuration shown in FIG. 1.

As FIG. 2 shows, the transistors Tr14 and Tr15 are substantially symmetrical with respect to a dotted line L2. Also, the transistors Tr14 and Tr15 both have a multiple finger configuration, in which rectangular fingers of bases, emitters, and collectors are arranged alternately like the teeth of a comb. The fingers of the transistor Tr14 and the fingers of the transistor Tr15 are parallel to each other, and also, substantially parallel to the dotted line L2.

A collector wiring WC20 of the transistor Tr14 extends from collector fingers C20 and C21. A base wiring WB20 extends from base fingers B20, B21, and B22. An emitter wiring WE20 extends from emitter fingers E20 and E21.

The transistor Tr15 also has the same configuration as the transistor Tr14. Specifically, a base wiring WB21, a collector wiring WC21, and an emitter wiring WE21 respectively extend from base fingers B23 to B25, collector fingers C23 and C24, and emitter fingers E23 and E24.

Here, a stray capacitance is generated between the two emitter wirings WE20 and WE21. A condenser C10 in FIG. 1 is an equivalent circuit indicating this stray capacitance. To enable an electric current to flow thorough the resistors R10 and R11, an electric charge corresponding to the stray capacitance needs to be accumulated. Therefore, an operation delay corresponding to the time taken for accumulating the electric charge is inevitable. This makes it difficult for an electric current to flow through the resistors R10 and R11 at the time of high-frequency operation. Accordingly, the adjustment of an input dynamic range of the differential amplification circuit formed by the transistors Tr14 and Tr15 becomes difficult. The problem is, therefore, that the Gilbert cell 1 may not be able to achieve desired performances at the time of high-frequency operation.

Here, although FIG. 2 shows the transistors Tr14 and Tr15 each including seven fingers, the number of fingers may be increased to keep up with increased requirements of transistor performances. In this case, desired performances of the transistors may not be achieved at the time of high-frequency operation. As described above, integrated circuit devices that include a differential amplification circuit are known to suffer from various problems at the high-frequency operation. This has resulted in increasing demands for integrated circuit devices that can operate normally even in a high-frequency area.

SUMMARY OF THE INVENTION

In view of the above problems, the objective of the present invention is to provide an integrated circuit device that includes a differential amplification circuit and that can operate normally even at high frequency.

The above objective of the present invention can be achieved by an integrated circuit device, including: a first bipolar transistor; a second bipolar transistor that is positioned to be adjacent to the first bipolar transistor; a first wiring that is electrically connected to an emitter of the first bipolar transistor and extends therefrom into a direction opposite to the second bipolar transistor with respect to the first bipolar transistor; and a second wiring that is electrically connected to an emitter of the second bipolar transistor and extends therefrom into a direction opposite to the first bipolar transistor with respect to the second bipolar transistor, wherein the first bipolar transistor and the second bipolar transistor form a differential amplification circuit.

With this configuration, a stray capacity between the first emitter wiring and the second emitter wiring can be reduced, and therefore, the above-described case where an input dynamic range cannot be adjusted appropriately at the high-frequency operation can be avoided. This enables desired performances of the integrated circuit device to be achieved.

The above objective of the present invention can also be achieved by an integrated circuit device, including a Gilbert cell that includes the integrated circuit device, including: a first bipolar transistor; a second bipolar transistor that is positioned to be adjacent to the first bipolar transistor; a first wiring that is electrically connected to an emitter of the first bipolar transistor and extends therefrom into a direction opposite to the second bipolar transistor with respect to the first bipolar transistor; and a second wiring that is electrically connected to an emitter of the second bipolar transistor and extends therefrom into a direction opposite to the first bipolar transistor with respect to the second bipolar transistor, wherein the first bipolar transistor and the second bipolar transistor form a differential amplification circuit.

With this configuration, a Gilbert cell that can operate normally even at high frequency can be realized.

The above objective of the present invention can also be achieved by an integrated circuit device, including: a controlled-potential power source wiring; a first bipolar transistor; a second bipolar transistor that is positioned to be opposite to the first bipolar transistor with respect to the controlled-potential power source wiring; a third bipolar transistor that is positioned in such a manner that a collector thereof is close to a base of the first bipolar transistor and is electrically connected to the base of the first bipolar transistor and the controlled-potential power source wiring; a fourth bipolar transistor that is positioned in such a manner that a collector thereof is close to a base of the second bipolar transistor and is electrically connected to the base of the second bipolar transistor and the controlled-potential power source wiring.

With this configuration, a length of a wiring between an input terminal and an output terminal can be shortened, and the capacity of the wiring can be reduced accordingly. This enables high-frequency performances of a differential amplifier to be improved.

BRIEF DESCRIPTION OF THE DRAWINGS

These and other objects, advantages and features of the invention will become apparent from the following description thereof taken in conjunction with the accompanying drawings that illustrate a specific embodiment of the invention.

In the drawings.

DESCRIPTION OF THE PREFERRED EMBODIMENTS

The following describes preferred embodiments of the present invention, with reference to the drawings.
(First Embodiment)

Figure 1:
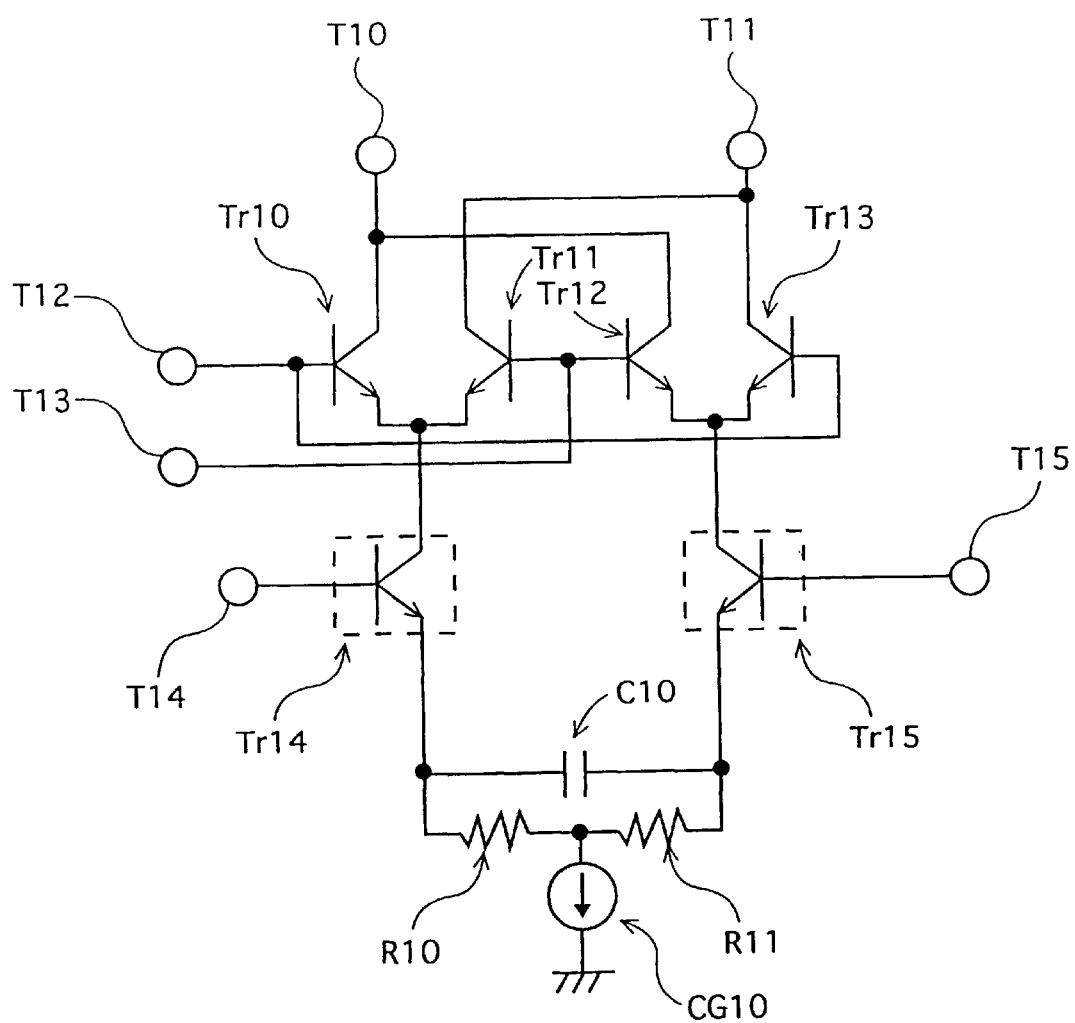
FIG. 1 is a circuit diagram showing a circuit configuration of a typical Gilbert cell.
Figure 3:
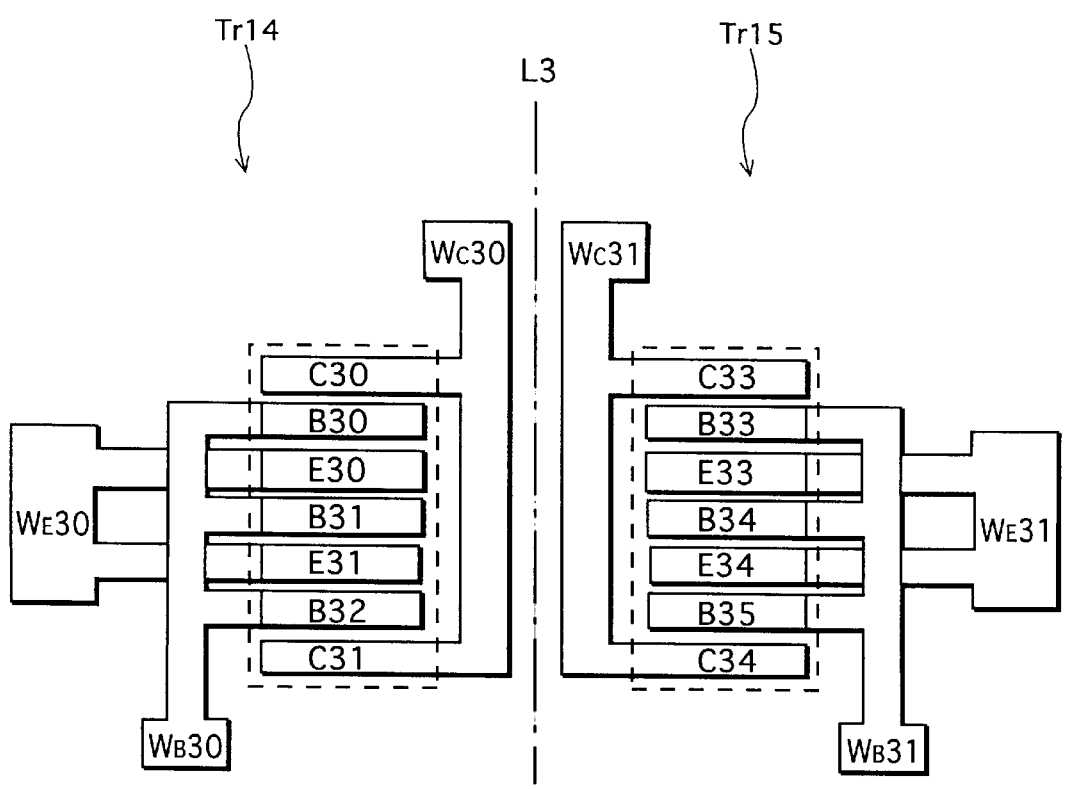
FIG. 3 shows a circuit layout relating to a first embodiment of the present invention for the transistors Tr14 and Tr15 of the Gilbert cell in FIG. 1.

The following describes a first embodiment of the integrated circuit device relating to the present invention, by taking a Gilbert cell for example. The Gilbert cell relating to the present embodiment has a circuit configuration shown in FIG. 1, and is characterized by a circuit layout of its transistors, i.e., the transistors Tr14 and Tr15. FIG. 3 shows the circuit layout of the transistors Tr14 and Tr15 relating to the present embodiment.

As FIG. 3 shows, the bipolar transistors Tr14 and Tr15 both have a multiple finger configuration. The transistors Tr14 and Tr15 are substantially symmetrical with respect to the dotted line L3. The transistor Tr14 includes collector fingers C30 and c31 connected to a collector wiring WC30, emitter fingers E30 and E31 connected to an emitter wiring WE30, and base fingers B30 to B32 connected to a base wiring WB30.

The transistor Tr15 includes collector fingers C33 and C34 connected to a collector wiring WC31, emitter fingers E33 and E34 connected to an emitter wiring WE31, and base fingers B33 to B35 connected to a base wiring WB31.

A longitudinal direction of the fingers of the transistor T14 is the same as that of the fingers of the transistor Tr15. The longitudinal direction is orthogonal to the dotted line L3. Also, the fingers of the transistor Tr14 are opposite to the corresponding fingers of the transistor T15, with respect to the dotted line L3. For example, the collector finger C30 of the transistor Tr14 is opposite to the collector finger C33 of the transistor Tr15 with respect to the dotted line L3.

Figure 4:
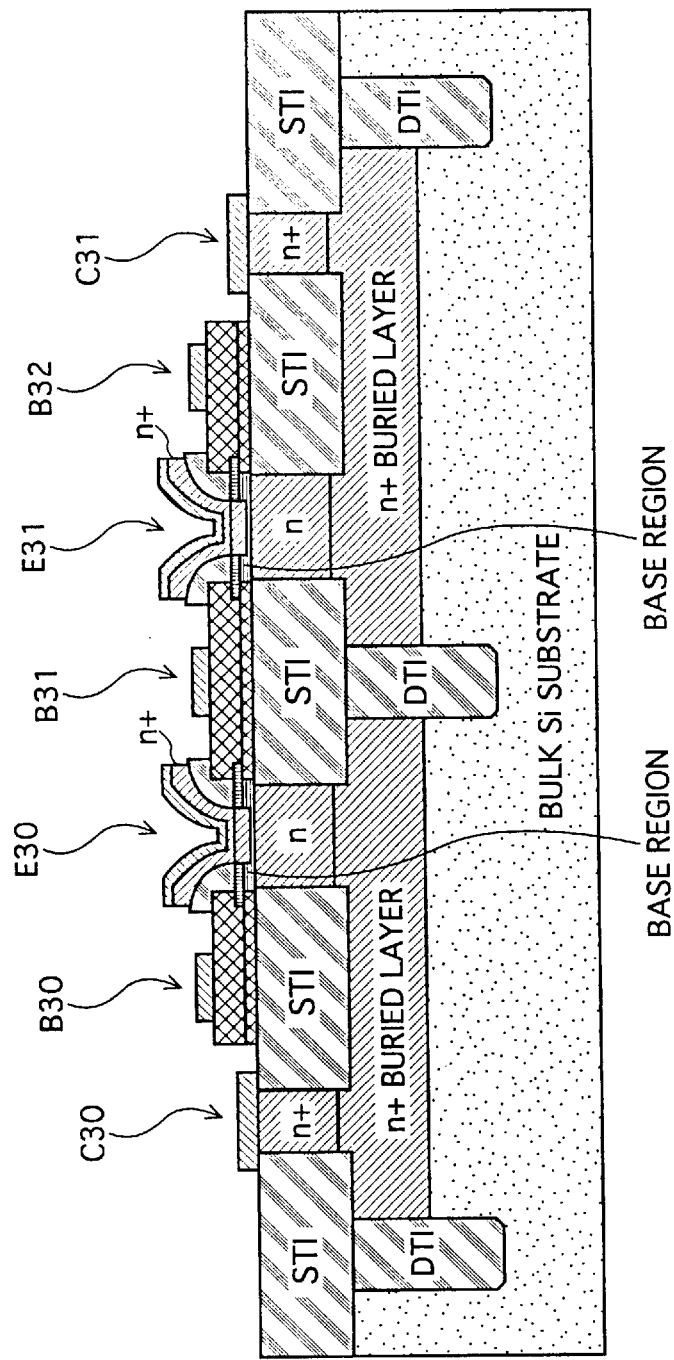
FIG. 4 is a cross sectional view of the transistor Tr14 taken substantially along a line parallel to the dotted line L3 in FIG. 3, showing collector fingers C30 and C31, base fingers B30 to B32, and emitter fingers E30 and E31.

FIG. 4 is a schematic cross sectional view of the transistor Tr14 taken substantially along a line parallel to the dotted line L3 in FIG. 3. The figure shows the collector fingers C30 and C31, the base fingers B30 to B32, and the emitter fingers E30 and E31 of the transistor Tr14. It should be noted here that the cross section of the transistor Tr14 is the same as that of the transistor Tr15, and so only the transistor Tr14 is described here.

The transistor Tr14 is constructed by a bulk silicon device formed on a bulk silicon substrate. To be more specific, an n+ buried layer divided by deep trench isolations (DTI) is formed on the bulk silicon substrate.

An n layer and an n+ layer divided by shallow trench isolations (STI) are formed on the n+buried layer. The collector fingers C30 and C31 are formed on the n+ layer. Base regions are provided on the n layer, and are connected to the base fingers B30 to B32.

An n+ layer is formed on the n layer, forming the emitter fingers E30 and E31. Note here that the n+ layer is insulated from the base fingers B30 to B32 by an insulating layer.

Figure 2:
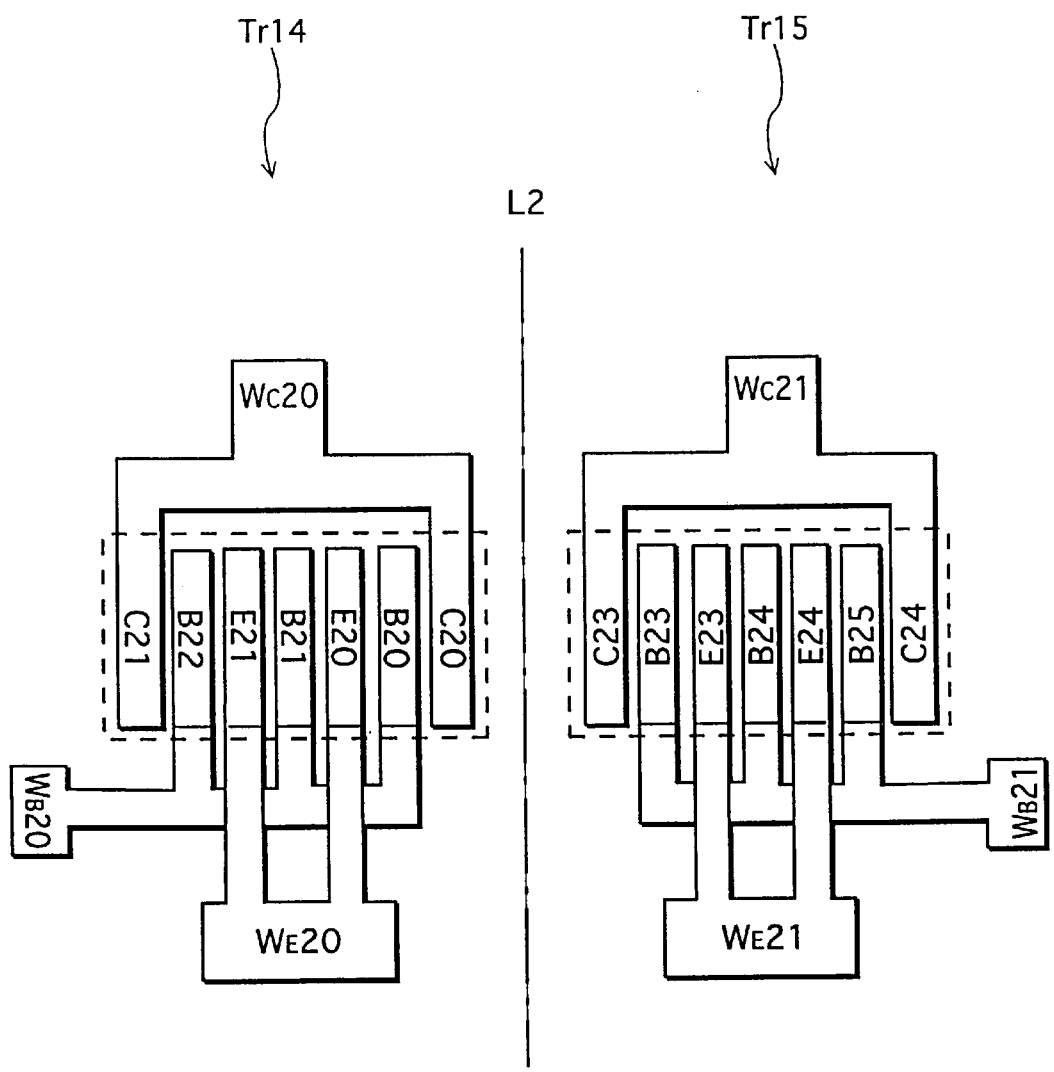
FIG. 2 shows an example of a conventional circuit layout for transistors Tr14 and Tr15 of the Gilbert cell in FIG. 1.

In the conventional circuit configuration shown in FIG. 2, a stray capacitance is generated between corresponding two fingers of the two transistors. For example, a stray capacitance is generated between the collector finger C20 of the transistor Tr14 and the collector finger C23 of the transistor Tr15, and a stray capacitance is generated between the collector finger C21 of the transistor Tr14 and the collector finger C24 of the transistor Tr15.

The larger the distance between each of two fingers and the dotted line L2, the larger the stray capacitance generated between the two fingers. In the conventional circuit layout, a maximum value of the distance between two fingers increases as a larger number of fingers are provided. This means that a maximum value of a generated stray capacitance increases as a larger number of fingers are provided. To operate the transistor Tr14, an electric charge corresponding to the stray capacitance first needs to be accumulated (charged) in the fingers, and therefore, the operation speed of the transistor Tr14 is largely affected by the maximum value of the stray capacitance. In the conventional circuit layout, therefore, the operation speed of the transistor Tr14 is slowed down as the number of fingers increases, resulting in desired performances not being achieved at the high-frequency operation.

On the other hand, if a circuit layout relating to the present invention is adopted, any increase in the number of fingers of a pair of transistors to keep up with required performances only results in the transistors being made large in the direction of the dotted line L3, with no increase in the distance between any finger pair. Regardless of the number of fingers, a stray capacitance remains the same, and a maximum value of the stray capacitance remains the same. Therefore, the operation speed of the transistors is not affected by the number of fingers.

Figure 5:
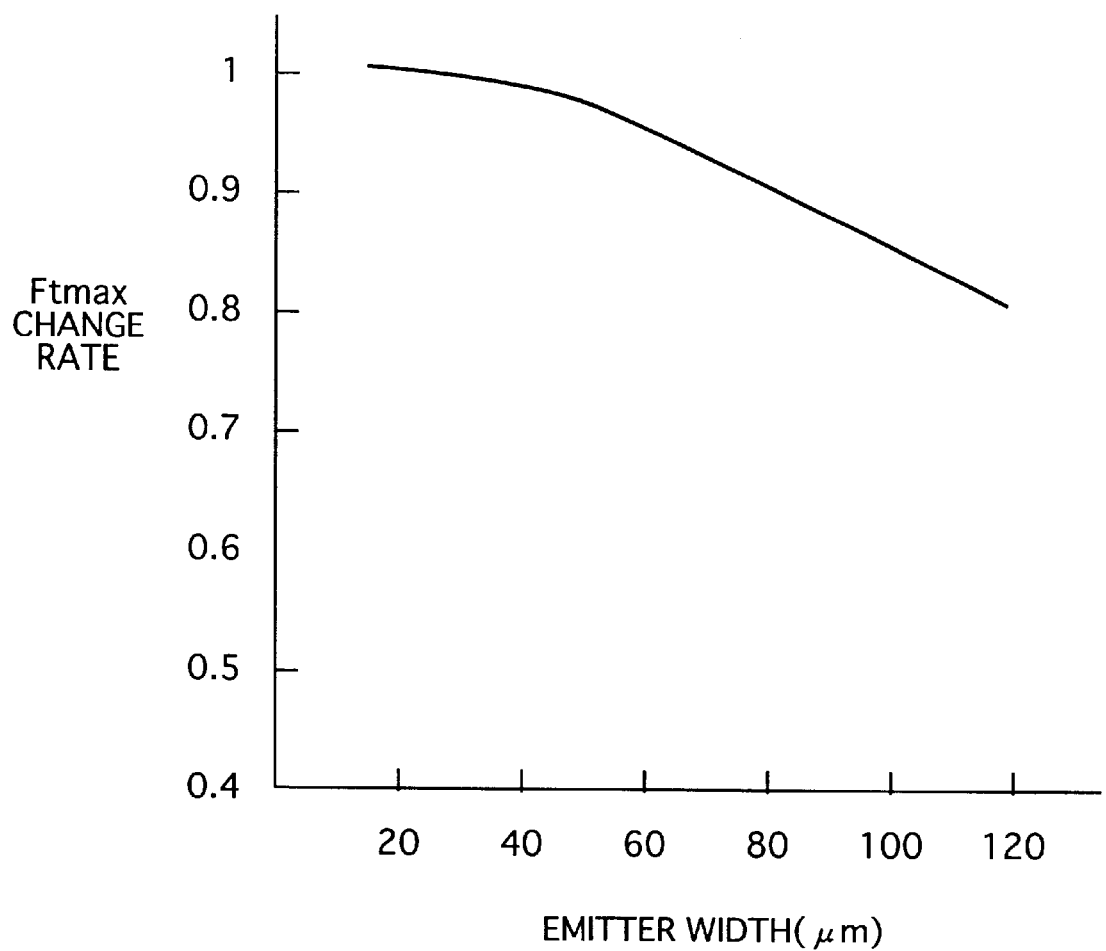
FIG. 5 is a graph showing the relationship between an emitter width and a maximum value "Ftmax" of a cutoff frequency for one bipolar transistor.

Here, the capacity of the transistors can also be expanded by increasing a size of each finger in the longitudinal direction, other than by increasing the number of fingers as described above. However, increasing a size of each finger in the longitudinal direction has a limit as follows. FIG. 5 is a graph showing the relationship between a size of an emitter finger in the longitudinal direction (hereafter referred to as an "emitter width") and a maximum value "Ftmax" of a cutoff frequency for one bipolar transistor. The vertical axis shows a change rate of "Ftmax", and the horizontal axis shows an emitter width.

As can be seen from FIG. 5, the larger the emitter width, the more a high-frequency characteristic of the transistor deteriorates. The upper limit of the emitter width, therefore, is considered to be approximately 30 $\mu$m, though it may depend on the configuration of the transistor. In view of this, it is rather preferable to increase the number of fingers for expanding the capacity of the transistor. The present invention is suitable in use for increasing the number of fingers, and accordingly, the present invention is considered effective to expand the capacity of the transistor.

Also, an input dynamic range of a differential amplification circuit is usually increased as follows. Resistors (R10 and R11 in FIG. 1) are connected to emitters of the transistors, and gain is adjusted with the use of the resistors, so as to improve linearity. On the contrary, in the circuit layout shown in FIG. 2, the emitter wiring WE20 and the emitter wiring WE21 are close to each other, and so a capacity coupling occurs between these emitter wirings (C10 in FIG. 1). An influence of the stray capacitance hinders the effects of circuit components such as the resistors at the time of high-frequency operation, making the gain adjustment of the transistor difficult. This causes performances of the differential amplification circuit to deteriorate.

On the other hand, according to the present embodiment, the distance between the emitter wiring WE30 and the emitter wiring WE31 is large, and so the above-mentioned capacity coupling can be minimized. Therefore, the deterioration of performances of the Gilbert cell described above can be avoided.

In the present embodiment, the distance between the collector wiring WC30 and the collector wiring WC31 is small. In a Gilbert cell, however, these wirings each have substantially the same electric potential. Therefore, even if a stray capacitance is generated between the collector wirings WC30 and WC31, the performances of the Gilbert cell is not affected.

Figure 6:
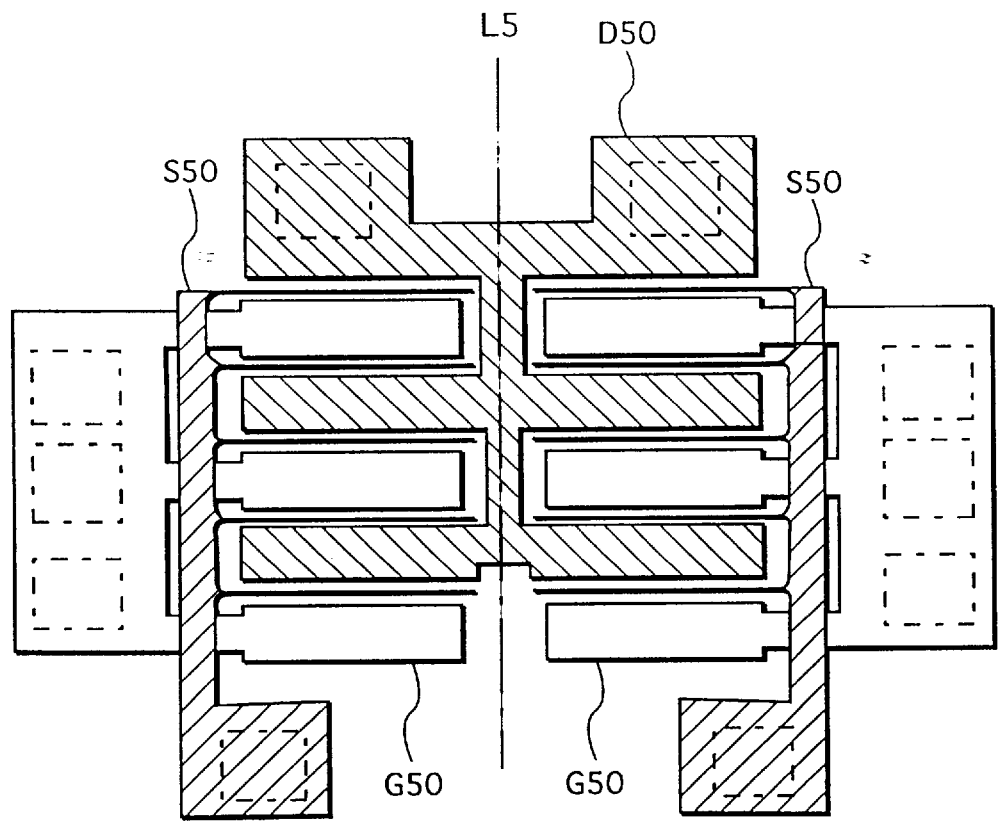
FIG. 6 shows a circuit layout disclosed in Japanese published unexamined application No. H4-125941.

Here, the following describes an example of a circuit layout that appears, at first glance, to be similar to the circuit layout relating to the present embodiment, that is, a circuit layout disclosed in Japanese published unexamined application No. H4-125941 (hereafter referred to as "cited application"). The following description clearly distinguishes the circuit layout relating to the present embodiment from the circuit layout relating to the cited application. FIG. 6 shows the circuit layout relating to the cited application.

As FIG. 6 shows, the cited application discloses the invention relating to a circuit layout of one transistor. According to the disclosure, a field effect transistor (FET) 5 has a multiple finger configuration. A drain D50 is positioned in the middle, and gates G50 and sources S50 are positioned at both sides of the drain D50. Also, the FET 5 has a symmetrical configuration with respect to a dotted line L5.

According to this configuration, when the gate width is increased, a length of a bonding wire to each of the electrodes D50, G50, and S50 can be made short, and therefore, a source inductance can be reduced. In this way, the circuit layout disclosed in the cited application does not aim at the above-described objectives relating to a Gilbert cell, namely, improving high-frequency characteristics and solving the problem of stray capacitance in a pair of transistors. Also, the circuit layout disclosed in the cited application cannot produce the effects produced by the Gilbert cell of the present invention. In conclusion, the cited application relates to a technique completely different from the present invention.

(Second Embodiment)

Figure 7:
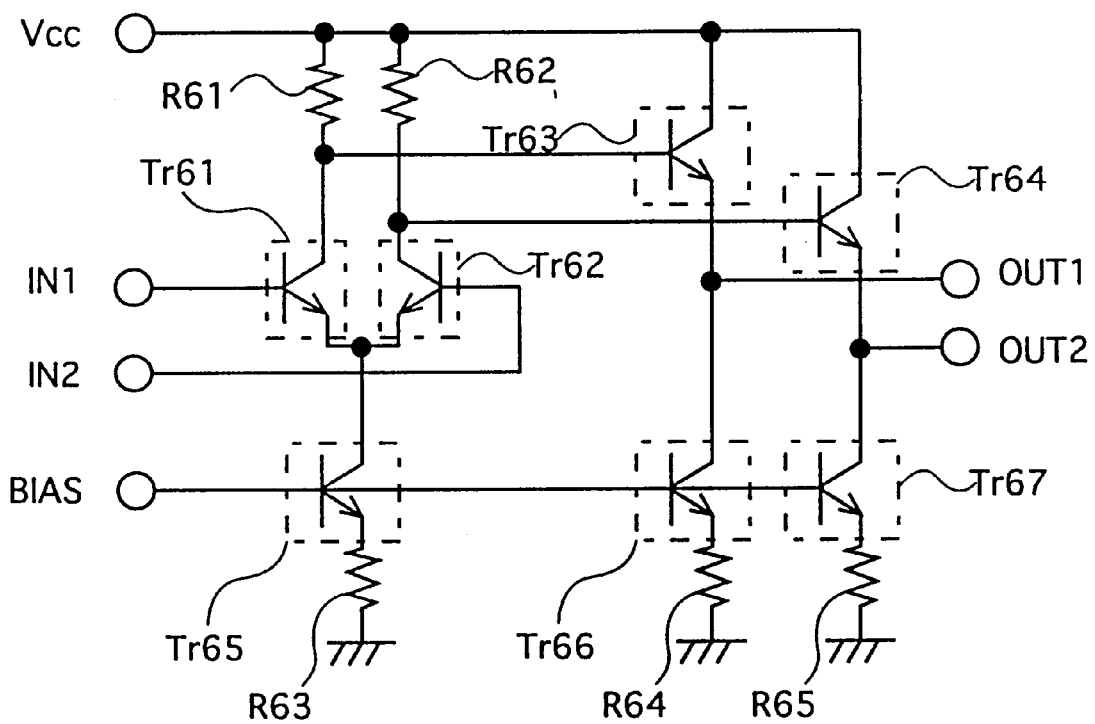
FIG. 7 is a circuit diagram showing a circuit configuration of a differential amplifier equipped with an emitter follower relating to a second embodiment of the present invention.

The following describes a second embodiment of the integrated circuit device relating to the present invention, by taking a differential amplifier equipped with an emitter follower (hereafter simply referred to as an "amplifier") for example, with reference to the drawings. FIG. 7 is a circuit diagram showing a circuit configuration of the integrated circuit device relating to the present embodiment.

As FIG. 7 shows, an amplifier 6 includes two input terminals IN1 and IN2, two output terminals OUT1 and OUT2, and a controlled-potential power source terminal Vcc, and a bias terminal BIAS. Transistors Tr61 and Tr62 and resistors R61 and R62 form a differential amplification circuit. A transistor Tr65 operates as a constant current source of the differential amplification circuit.

Transistors Tr63 and Tr64 each form an emitter follower. A current amplification of an output of the differential amplification circuit formed by the transistors Tr61 and Tr62 is achieved by connecting a base of the transistor Tr63 to a collector of the transistor Tr61 and connecting a base of the transistor Tr64 to a collector of the transistor Tr62.

Transistors Tr66 and Tr67 respectively function as constant current sources of emitter followers formed by the transistors Tr63 and Tr64. An operating current value of the amplifier 6 is determined based on a resistance value of each of the resistors R63 to R65 and a voltage value applied to the bias terminal BIAS.

Figure 8:
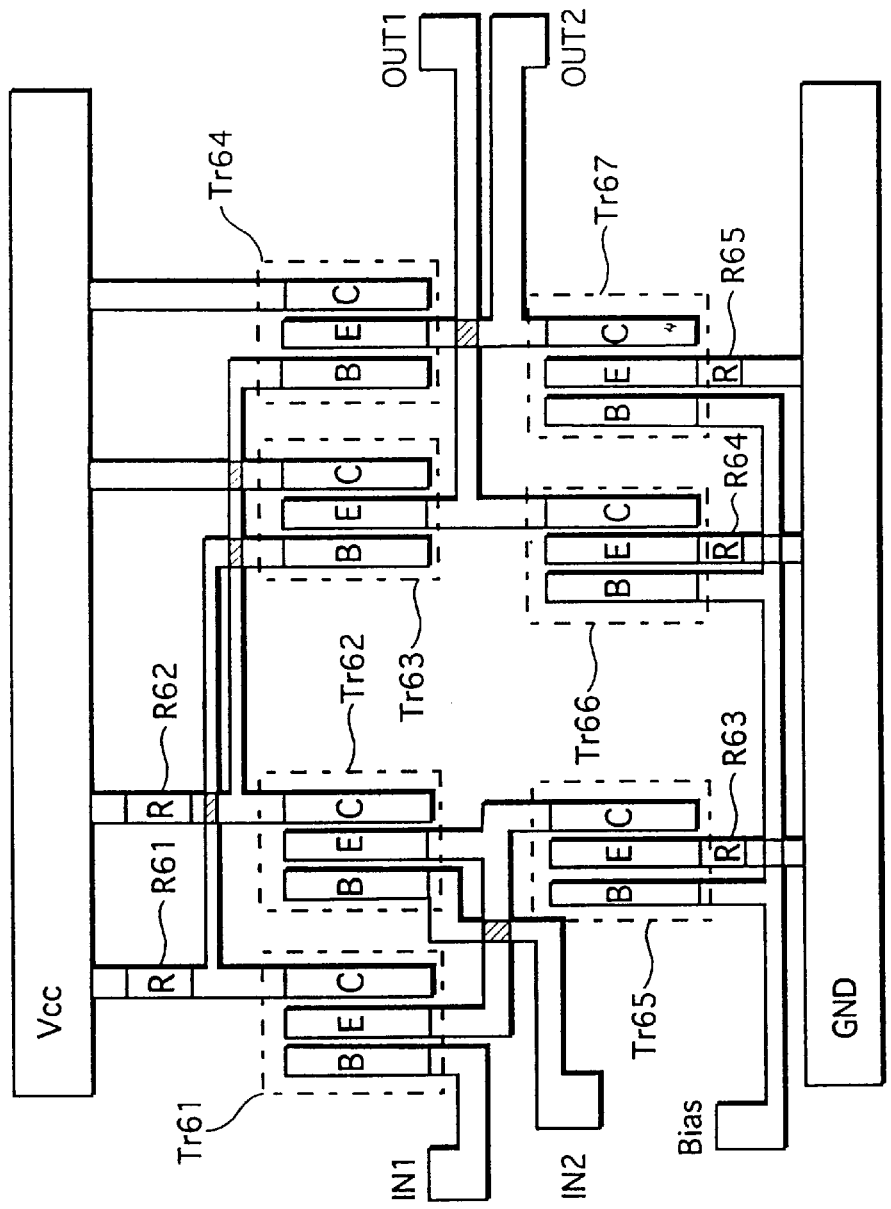
FIG. 8 shows an example of a conventional circuit layout of the differential amplifier in FIG. 7.

The amplifier 6 with the above-described circuit configuration has conventionally adopted a circuit layout shown in FIG. 8. The circuit layout in FIG. 8 is specifically traced from the circuit diagram shown in FIG. 7. In the conventional circuit layout in FIG. 8, an input wiring crosses over an output wiring at several points (shaded portions in the figure). This may cause problems such that gain of the differential amplification circuit decreases, and the above described stray capacitance is generated, etc., resulting in performances of the differential amplification circuit deteriorating at the time of high-frequency operation.

Figure 9:
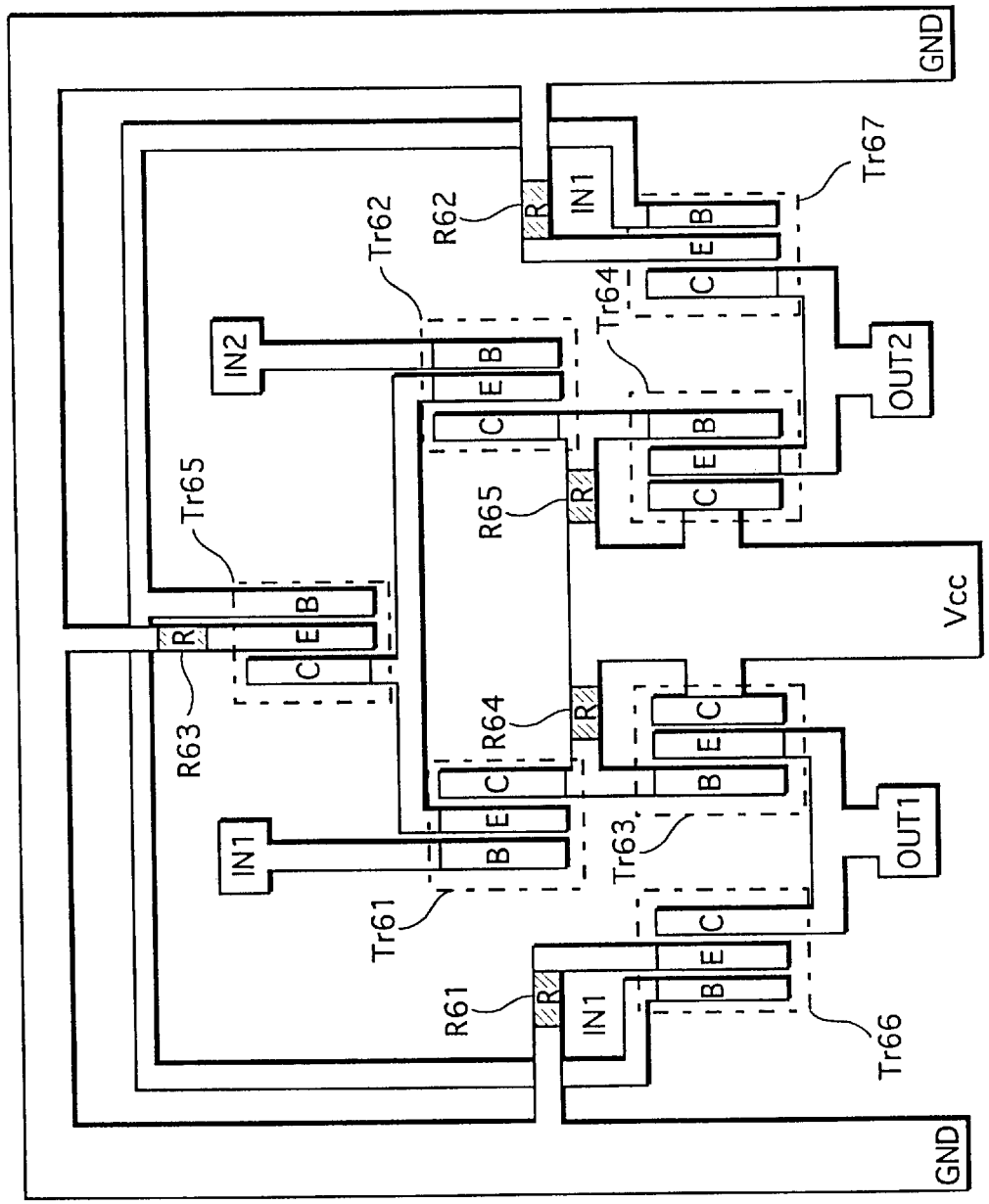
FIG. 9 shows a circuit layout of a conventional stand-alone transistor.

The following describes a circuit layout of the amplifier 6 relating to the present embodiment. FIG. 9 shows a circuit layout of the amplifier 6 relating to the present embodiment. As FIG. 9 shows, a wiring Vcc that is a controlled-potential power source wiring is laid in the middle of the circuit. Transistors Tr63 and Tr64 both having a multiple finger configuration are positioned parallel to each other with the wiring Vcc provided between them, and with electrodes being arranged in such a manner that collector fingers of the transistors Tr63 and Tr64 are close to the wiring Vcc.

A transistor Tr61 is positioned so that its collector finger is close to a base finger of the transistor Tr63. The fingers of the transistor Tr61 are arranged in the same direction and in the same order as the fingers of the transistor Tr63. An input terminal IN1 is positioned opposite to the transistor Tr63 with respect to the transistor Tr61.

In the same manner, a transistor Tr62 is positioned so that its collector finger is close to a base finger of the transistor Tr64, with the fingers of the transistor Tr62 being arranged in the same direction and in the same order as the fingers of the transistor Tr64. Also, an input terminal IN2 is positioned opposite to the transistor Tr64 with respect to the transistor Tr62.

A transistor Tr65 is positioned between (a) a wiring connecting the input terminal IN1 and a base finger of the transistor Tr61, and (b) a wiring connecting the input terminal IN2 and a base finger of the transistor Tr62. Also, a resistor R63 is positioned opposite to the wiring Vcc with respect to the transistor Tr65.

A transistor Tr66 is positioned opposite to the wiring Vcc with respect to the transistor Tr63, so that the fingers of the transistor Tr66 are arranged in the same direction and in the same order as the fingers of the transistor Tr63.

Also, an output terminal OUT1 is positioned opposite to the transistor Tr61 with respect to the transistors Tr63 and Tr66.

In the same manner, a transistor Tr67 is positioned opposite to the wiring Vcc with respect to the transistor Tr64, so that the fingers of the transistor Tr67 are arranged in the same direction and in the same order as the fingers of the transistor Tr64. An output terminal OUT2 is positioned opposite to the transistor Tr62 with respect to the transistors Tr64 and Tr67.

A resistor R64 is positioned between (a) a wiring connecting the base finger of the transistor Tr63 and the collector finger of the transistor Tr61, and (b) the wiring Vcc. In the same manner, a resistor R65 is positioned between (a) a wiring connecting the base finger of the transistor Tr64 and the collector finger of the transistor Tr62, and (b) the wiring Vcc.

A ground wiring GND is laid so as to surround a periphery of the above-described circuit. A resistor R61 is positioned on a wiring connecting an emitter finger of the transistor Tr66 and the wiring GND. A resistor R62 is positioned on a wiring connecting an emitter finger of the transistor Tr67 and the wiring GND. It should be noted that a semiconductor substrate on which the amplifier 6 is to be formed is not shown in the figure.

With the circuit layout described above, an overhead crossing of the input wiring and the output wiring of the amplifier can be eliminated, thereby solving the problems caused by the above-described conventional circuit layout. Also, as compared with the conventional circuit layout, a length of the wiring connecting the base finger of the transistor Tr63 and the collector finger of the transistor Tr61, and a length of the wiring connecting the base finger of the transistor Tr64 and the collector finger of the transistor Tr62 can be shortened to a great extent. Due to this, performances of the amplifier at the time of high-frequency performances can be improved.

(Modifications)

Although the present invention has been described based on the preferred embodiments as above, it should be clear that the present invention is not limited to the above embodiments. For example, the following modifications are possible.

Although the above embodiments describe the Gilbert cell and the differential amplifier that use bipolar transistors, the same effects as described above can be produced when field effect transistors are used instead of the bipolar transistors. When the bipolar transistors are replaced with the field effect transistors, the emitters and the collectors respectively correspond to sources and drains.

Also, all the above bipolar transistors may be replaced with field effect transistors, or some of the above bipolar transistors may be replaced with field effect transistors.

As it is clear from descriptions given in the above embodiments, the present invention is not limited to the field of wireless communications, but can produce the effects in other fields where integrated circuit devices are required to operate at high frequency.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. An integrated circuit device, comprising:

a first bipolar transistor;

a second bipolar transistor that is positioned to be adjacent to the first bipolar transistor;

a first wiring that is electrically connected to an emitter of the first bipolar transistor and extends therefrom into a direction opposite to the second bipolar transistor with respect to the first bipolar transistor; and a second wiring that is electrically connected to an emitter of the second bipolar transistor and extends therefrom into a direction opposite to the first bipolar transistor with respect to the second bipolar transistor, wherein the first bipolar transistor and the second bipolar transistor form a differential amplification circuit, the first bipolar transistor and the second bipolar transistor are positioned to be substantially axially symmetrical to each other, and the integrated circuit device further includes a third wiring that is electrically connected to a base of the first bipolar transistor and is substantially parallel to the axis of symmetry, and a fourth wiring that is electrically connected to a base of the second bipolar transistor and is substantially parallel to the axis of symmetry.

2. The integrated circuit device of claim 1, wherein at least one of the first bipolar transistor and the second bipolar transistor is replaced with a field effect transistor, and a source of the field effect transistor corresponds to an emitter of the replaced bipolar transistor.

3. The integrated circuit of claim 1, wherein the first bipolar transistor is a multiple finger transistor; and the second bipolar transistor is a multiple finger transistor the axis of symmetry of the second bipolar transistor being orthogonal to a longitudinal direction of fingers of the first bipolar transistor, a longitudinal direction of fingers of the second bipolar transistor being orthogonal to the axis of symmetry.

4. The integrated circuit device of claim, 1, wherein at least one of the first bipolar transistor and the second bipolar transistor is replaced with a field effect transistor.

5. An integrated circuit device of claim 1, wherein the integrated circuit device is part of a Gilbert cell.

6. An integrated circuit device, comprising:

a first bipolar transistor;

a second bipolar transistor that is positioned to be adjacent to the first bipolar transistor;

a first wiring that is electrically connected to an emitter of the first bipolar transistor and extends therefrom into a direction opposite to the second bipolar transistor with respect to the first bipolar transistor; and a second wiring that is electrically connected to an emitter of the second bipolar transistor and extends therefrom into a direction opposite to the first bipolar transistor with respect to the second bipolar transistor, wherein the first bipolar transistor and the second bipolar transistor form a differential amplification circuit, the first bipolar transistor and the second bipolar transistor are positioned to be axially symmetrical to each other, and the integrated circuit device further includes a fifth wiring that is electrically connected to a collector of the first bipolar transistor and is substantially parallel to the axis of symmetry, and a sixth wiring that is electrically connected to a collector of the second bipolar transistor and is substantially parallel to the axis of symmetry.

7. An integrated circuit device, comprising:

a controlled-potential power source wiring;

a first bipolar transistor;

a second bipolar transistor that is positioned to be opposite to the first bipolar transistor with respect to the controlled-potential power source wiring;

a third bipolar transistor that is positioned in such a manner that a collector thereof is close to a base of the first bipolar transistor and is electrically connected to the base of the first bipolar transistor and the controlled-potential power source wiring;

a fourth bipolar transistor that is positioned in such a manner that a collector thereof is close to a base of the second bipolar transistor and is electrically connected to the base of the second bipolar transistor and the controlled-potential power source wiring.

8. The integrated circuit device of claim 7, wherein the first bipolar transistor is a multiple finger transistor, a longitudinal direction of fingers of the first bipolar transistor is substantially parallel to a longitudinal direction of the controlled-potential power source wiring, a collector finger of the first bipolar transistor is close to the controlled-potential power source wiring, the second bipolar transistor is a multiple finger transistor, a longitudinal direction of fingers of the second bipolar transistor is substantially parallel to the longitudinal direction of the controlled-potential power source wiring, a collector finger of the second bipolar transistor is close to the controlled-potential power source wiring.

9. The integrated circuit device of claim 7, wherein at least one of the first to fourth bipolar transistors is replaced with a field effect transistor, a source of the field effect transistor corresponds to an emitter of the replaced bipolar transistor, and a drain of the field effect transistor corresponds to a collector of the replaced bipolar transistor.

10. The integrated circuit device of claim 7, further comprising a ground wiring that externally surrounds the controlled-potential power source wring and the first to fourth bipolar transistors.

11. The integrated circuit device of claim 10, further comprising:

a fifth bipolar transistor whose collector is electrically connected to an emitter of the first bipolar transistor, and whose emitter is electrically connected to the ground wiring via a resistor;

a sixth bipolar transistor whose collector is electrically connected to an emitter of the second bipolar transistor, and whose emitter is electrically connected to the ground wiring via a resistor; and a seventh bipolar transistor whose collector is electrically connected to an emitter of the third bipolar transistor and an emitter of the fourth bipolar transistor, whose base is electrically connected to a base of the fifth bipolar transistor and a base of the sixth bipolar transistor, and whose emitter is electrically connected to the ground wiring via a resistor.

12. The integrated circuit device of claim 11, wherein at least one of the first to seventh bipolar transistors is replaced with a field effect transistor, a source of the field effect transistor corresponds to an emitter of the replaced bipolar transistor, and a drain of the field effect transistor corresponds to a collector of the replaced bipolar transistor.

* * * * *